United States Patent [19]

Alexandres et al.

[11] Patent Number: 5,761,792
[45] Date of Patent: Jun. 9, 1998

[54] METHOD FOR MAKING A BATTERY PACK

[75] Inventors: Richard B. Alexandres, Clear Lake; George W. Villeponteaux, Mason City, both of Iowa

[73] Assignee: Alexander Manufacturing Corporation, Mason City, Iowa

[21] Appl. No.: 690,951

[22] Filed: Aug. 1, 1996

Related U.S. Application Data

[63] Continuation of Ser. No. 886,869, May 22, 1992, abandoned, which is a continuation-in-part of Ser. No. 618,454, Nov. 27, 1990, abandoned.

[51] Int. Cl.$^6$ .................................................. H01M 2/10
[52] U.S. Cl. ............................ 29/623.3; 29/623.4; 429/99
[58] Field of Search ............................ 29/623.3, 623.4; 429/99

[56] References Cited

U.S. PATENT DOCUMENTS

| | | | |
|---|---|---|---|
| 3,075,866 | 1/1963 | Baker et al. | 29/846 |
| 3,339,169 | 8/1967 | Freeland | 429/121 |
| 4,920,019 | 4/1990 | Stoklosa et al. | 429/122 |

*Primary Examiner*—John S. Maples
*Attorney, Agent, or Firm*—Kenyon & Kenyon

[57] ABSTRACT

A flexible welding board for a battery pack, which is a polyester film or polymer with prepunched holes and a laminated nickel alloy or other metal or metal material. The polyester film with a suitable polymer adhesive or other adhesive includes a laminated nickel or other metal thereon. The nickel alloy or other metal alloy or metal is subsequently imaged with a pattern, and etched providing a flexible welding board for the welding of components of a battery pack, including the battery cells, electrical components and the electromechanical components which are spot-welded thereto. The entire process can be done robotically providing a battery pack which has electromechanical integrity between the battery cells, components, flexible welding board and the battery pack housing.

5 Claims, 5 Drawing Sheets

METHOD FOR MAKING A BATTERY PACK

This is a continuation of Ser. No. 07/886,869, filed May 22, 1992, now abandoned, which application is a Continuation-in-Part of U.S. Ser. No. 07/618,454, filed Nov. 27, 1990, now abandoned, entitled "Flexible Welding Board for Battery Pack," to the same assignee.

BACKGROUND TO THE INVENTION

1. Field of the Invention

The present invention pertains to a battery pack, and more particularly, a nickel cadmium battery pack, or battery pack with a nickel alloy, metal alloy or metal flexible welding board, which allows for the welding of battery cells, electrical components and electromechanical components, including the battery cells directly to the flexible welding board. The welding is preferably by spot-welding.

2. Description of the Prior Art

In the past, battery packs, particularly nickel cadmium battery packs, have been assembled by hand where the batteries are spot-welded to each other by flat straps, such as stainless steel or nickel. Then, the contacts are placed into the battery pack housing, and the batteries are again connected by spot-welding the flat straps to the battery contacts. Finally, the electrical or electromechanical components such as thermistors, resistors, capacitors and any other components are connected along the process to the straps or the contacts, such as by spot-welding or soldering. This type of process is labor intensive, and takes considerable time and motion by a group of individuals to assemble each battery pack.

Prior art flexible circuits were sometimes not practical, as the circuits could sometimes not be easily mass-produced, nor could the flexible circuits sometimes be easily spot-welded. Prior art flexible circuits were not able to include all of the components, including the battery cells, the electrical components and the electromechanical components such as the battery casing contacts. Prior art flex circuits did not lend themselves to mass production for use in NiCad or other types of battery packs.

Prior art flexible circuits were usually a copper material on a polymer. Prior to etching of the copper material, the copper had to sometimes be protected, such as by plating with a tin lead or a tin nickel. This was an additional time consuming step which added expense and labor.

Prior art standard flexible boards require soldering metal weld tabs to the board to allow battery cells to be welded to it thus adding expense and labor.

The present invention overcomes the disadvantages of the prior art by providing a unique and novel flexible welding board where all of the electrical components and electromechanical components can be spot-welded to the flexible welding board such as a polyester board for subsequent insertion into a battery housing or battery casing, thereby forming a battery pack. The elimination of the labor intensive operations of adding weld tabs prior to welding results in a significant cost savings, as well as allowing a more compact board design.

SUMMARY OF THE INVENTION

The general purpose of the present invention is a battery packing a flexible welding board of a nickel alloy or other metal alloy or metal laminated onto a deformable shape retaining polyester or polymer film with a co-extruded polymer adhesive or other suitable adhesive or material therebetween for inclusion within a battery pack. The electrical components and the electromechanical components can be directly welded onto the nickel alloy or other metal alloy of the flexible circuit board with subsequent placement inside a polymer casing of the battery pack, thereby forming a battery pack. The flexible welding board lends itself to mass production, particularly silk screening techniques, photographically imaged techniques, and etching techniques for forming the electrical circuit pattern on the nickel alloy or other metal alloy or metal which is laminated to the polymer film. The metal foil can also be any other suitable metal alloy or metal.

According to one embodiment of the present invention, there is provided a flexible bare back welding board for a battery pack including a polymer film a polyester film or polymer film base with apertures formed at the welding locations, suitable co-extruded or other adhesives or materials, and a laminated nickel or other metal alloy or metal. The nickel alloy or other metal alloy or metal can be silk screened, or lithographed on a laminated resist film applied to the metal with electrical circuit patterns, etched with suitable chemicals, and subsequently processed to provide a welding pattern of the nickel alloy or other metal alloy on the polymer or polyester film for subsequent electrical and electromechanical assembly, including battery cells, and electrical and electromechanical components to produce a battery pack. The battery cells, electrical components, electromechanical components and the flexible welding are positioned in a polymer casing, including the contacts which can be spot-welded to the flexible welding board to produce the battery pack. The nickel or other metal alloy material spot-welds like stainless steel, and is very desirable for spot-welding as is the metal stainless steel.

Significant aspects and features of the present invention provide a flexible welding board for a battery pack, such as a battery pack which can be spot-welded.

Another significant aspect and feature of the present invention is a flexible welding board which is adaptable to robotic manufacturing processes and robotic welding processes. The nickel alloy or other metal alloy or metal material particularly lends itself to spot-welding.

A further significant aspect and feature of the present invention is a flexible welding board such as polyester composition which provides for the attachment of electrical components, including battery cells, resistors, capacitors and thermistors, as well as electromechanical components such as battery pack contacts for battery chargers where the battery pack contacts mount within the polymer casing of the battery housing and are spot welded directly to the flexible welding board.

A further significant aspect and feature of the present invention is a flexible welding board having nickel alloy or other metal alloy battery interconnection straps and at least two contacts adhesively secured to a polymer or polyester flexible base. The base is so dimensioned and the contacts and straps so oriented and dimensioned such that automatic alignment of the straps and contacts with the battery terminals is effected when the base is formed about a battery pack.

A still further significant aspect and feature of the present invention is that the flexible welding board can be fabricated as individual boards on a continuous strip with discrete multiple circuit patterns formed thereon at spaced intervals. The strips with the boards temporarily attached thereto can be coiled for continuous processing. The strips can be formed in a process line and will retain the formed shape. This feature is particularly desirable in facilitating the placement of battery cells within the formed welding board.

Having thus described the preferred embodiments of the present invention, it is a principal object hereof to provide a flexible welding board for a battery pack, such as for a portable radio or any other electrical or electronic device.

One object of the present invention is a nickel alloy, other metal alloy or metal flexible welding board for use in a battery pack.

Another object of the present invention is a nickel alloy, other metal alloy, or metal flexible welding board which can be readily manufactured by automated etching processes.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
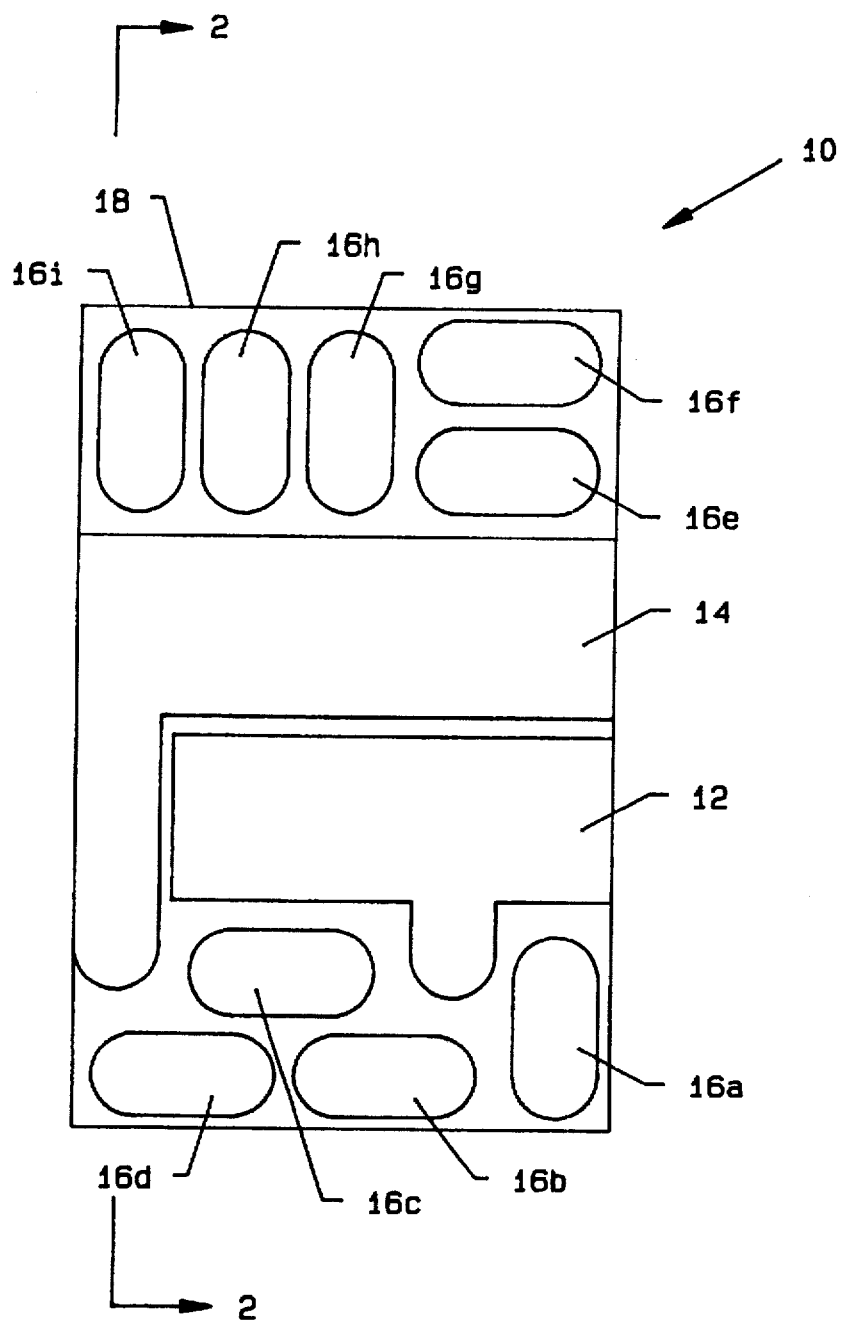
FIG. 1 illustrates a plan view of a flexible welding board, the present invention.

FIG. 1 illustrates a plan view of a bare back flexible welding board 10, the present invention, including a plus pad 12, a minus pad 14, and battery straps 16a–16n, all of which are adhesively secured to a polyester base 18, as later described in detail. The battery straps 16a–16n accommodate a plurality of cells, such as AA cells, by way of example and for purposes of illustration only, and not to be construed as limiting of the present invention. Any other size battery cell can be utilized. The battery cells can be alkaline, mercury, NiCad, or any other suitable type of cells. The battery straps 16a–16n wrap around the alternating cells, and in this instance, provide a 15 volt disposable alkaline battery for an electronic product, such as a portable radio such as a Handie-Talkie FM radio, also referred to as an "HT". An assembly of the cells and the bare back flexible welding board then engages into a molded plastic housing. The large flat rectangular portions form the contact pad points through holes in the molded polymer housing as later described in detail. The principals and teachings of the present invention can pertain to any other types of battery cells, and any other types of electrical and electromechanical configurations. The battery straps 16a–16n are spot-welded onto the ends of each cell, and the spot-welding occurs through holes in polyester film 18 to engage and make contact with the appropriate end of the cell, as later described in detail. Usually, it only takes two spot-welding electrodes to make contact, but in this instance, three or more spot-welding electrodes may be preferable for efficient electromechanical contact and for the appropriate surface area contact for current flow between the battery straps and the batteries. The metal battery strap material is a nickel or stainless steel alloy or other suitable metal alloy. This alloy of nickel or other material is laminated to a polyester film of a suitable thickness with a suitable adhesive. Any suitable metal alloy or metal can be utilized as well as any suitable base material such as a polymer base or any other type of base material as well as any material therebetween for sticking the numbers together.

Figure 2:
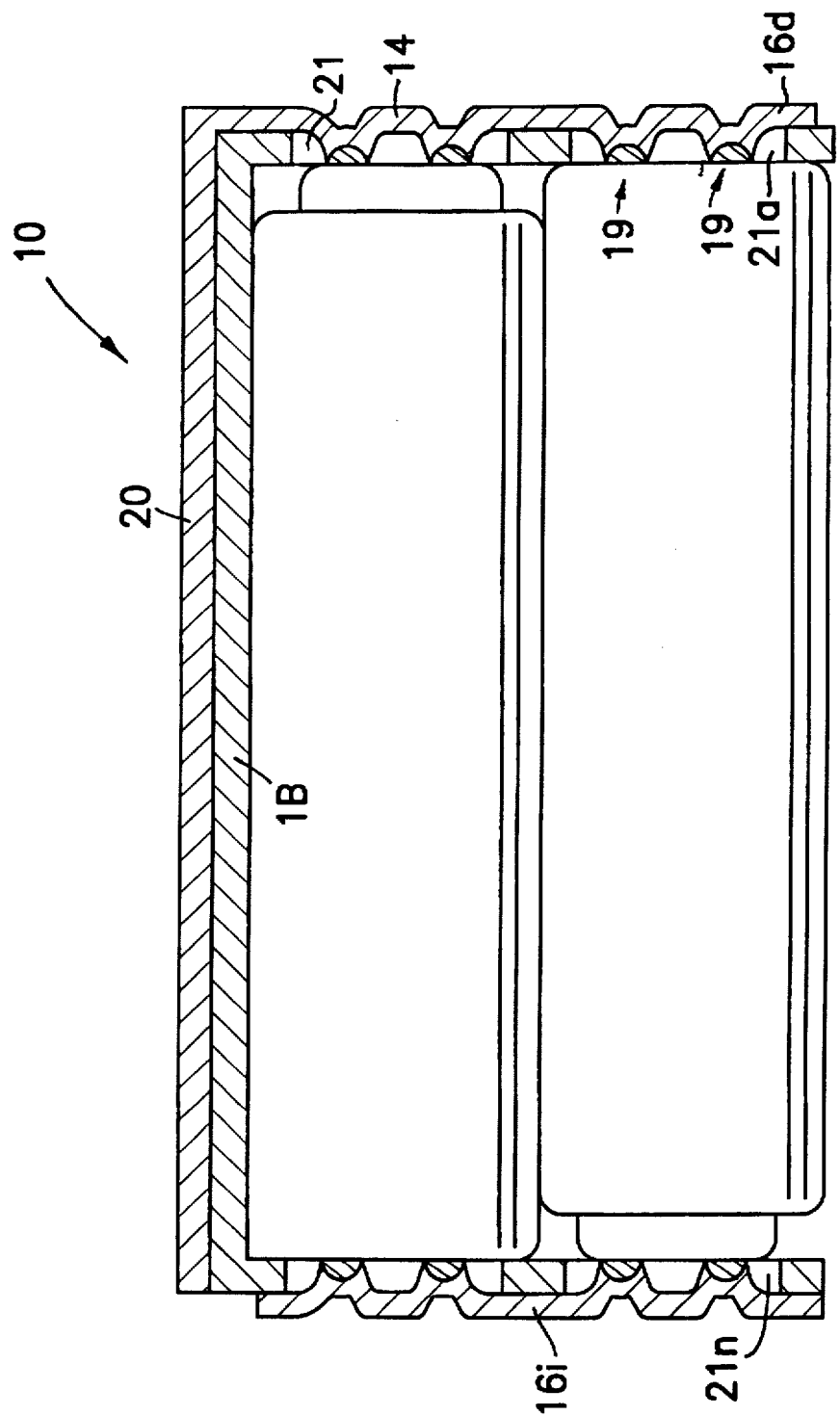
FIG. 2 illustrates an end view of the flexible welding board.

FIG. 2 illustrates an end view of the flexible bare backed welding board 10 including the polyester film 18, the adhesive which could be a co-extruded adhesive 20, and the battery straps 16a–16n. Two cells, having terminals at opposite ends, are appropriately positioned and spot welded to the straps of the flexible welding board 10. A typical weld 19 is made through the straps 16a–16n through the plurality of holes 21a–21n in the polyester film 18. The dimensions are exaggerated to appropriately illustrate the teachings of this patent.

Figure 3:
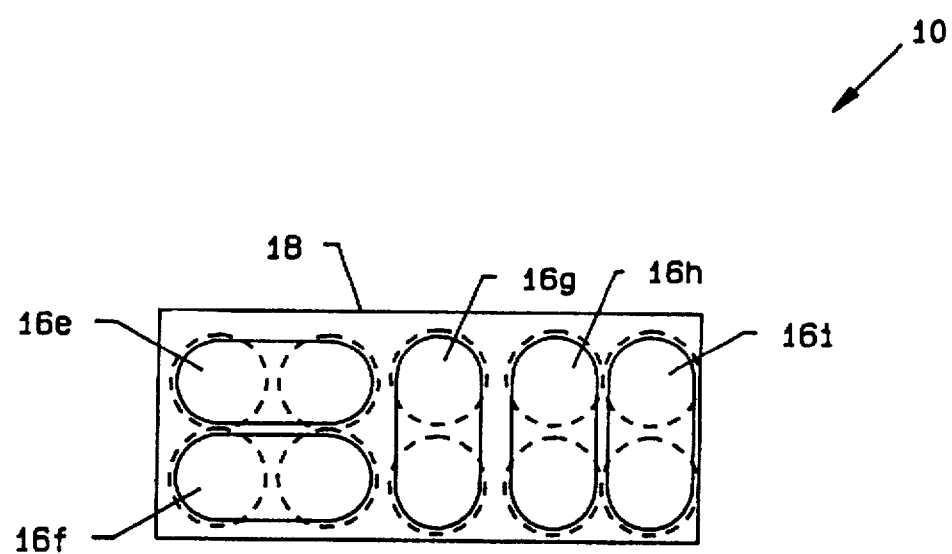
FIG. 3 illustrates a front view of the flexible welding board about battery cells taken along line 2—2 of FIG. 1, including two alternating size AA cells in place.

FIG. 3 illustrates a front view of the flexible bare backed welding board 10 engaged about battery cells of alternating size AA cells in place. All other numerals correspond to those elements previously described.

Figure 4:
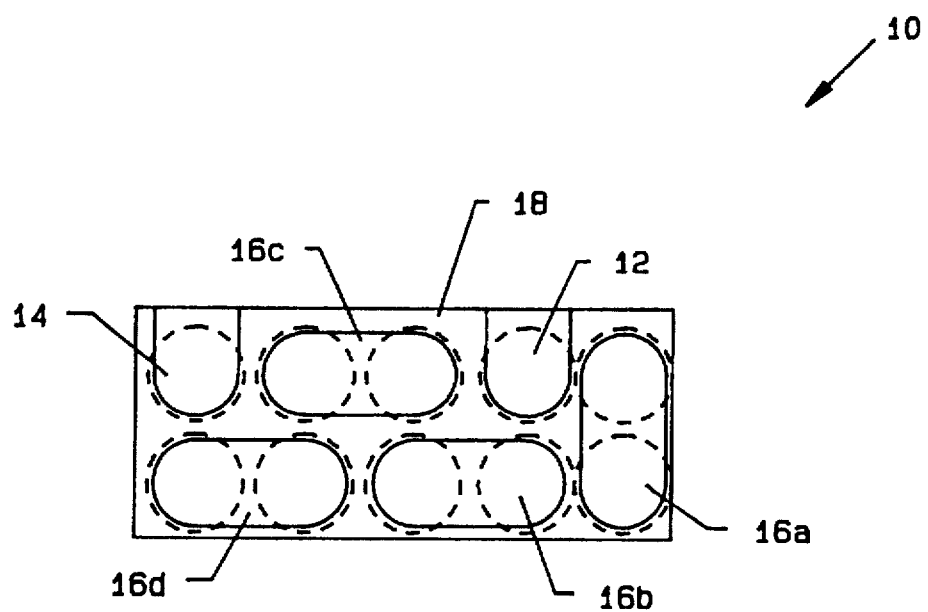
FIG. 4 illustrates a back view of a flexible welding board.

FIG. 4 illustrates a back view of the flexible welding board 10 of FIG. 2. All numerals correspond to those elements previously described, including the alternating battery cells.

Figure 5:
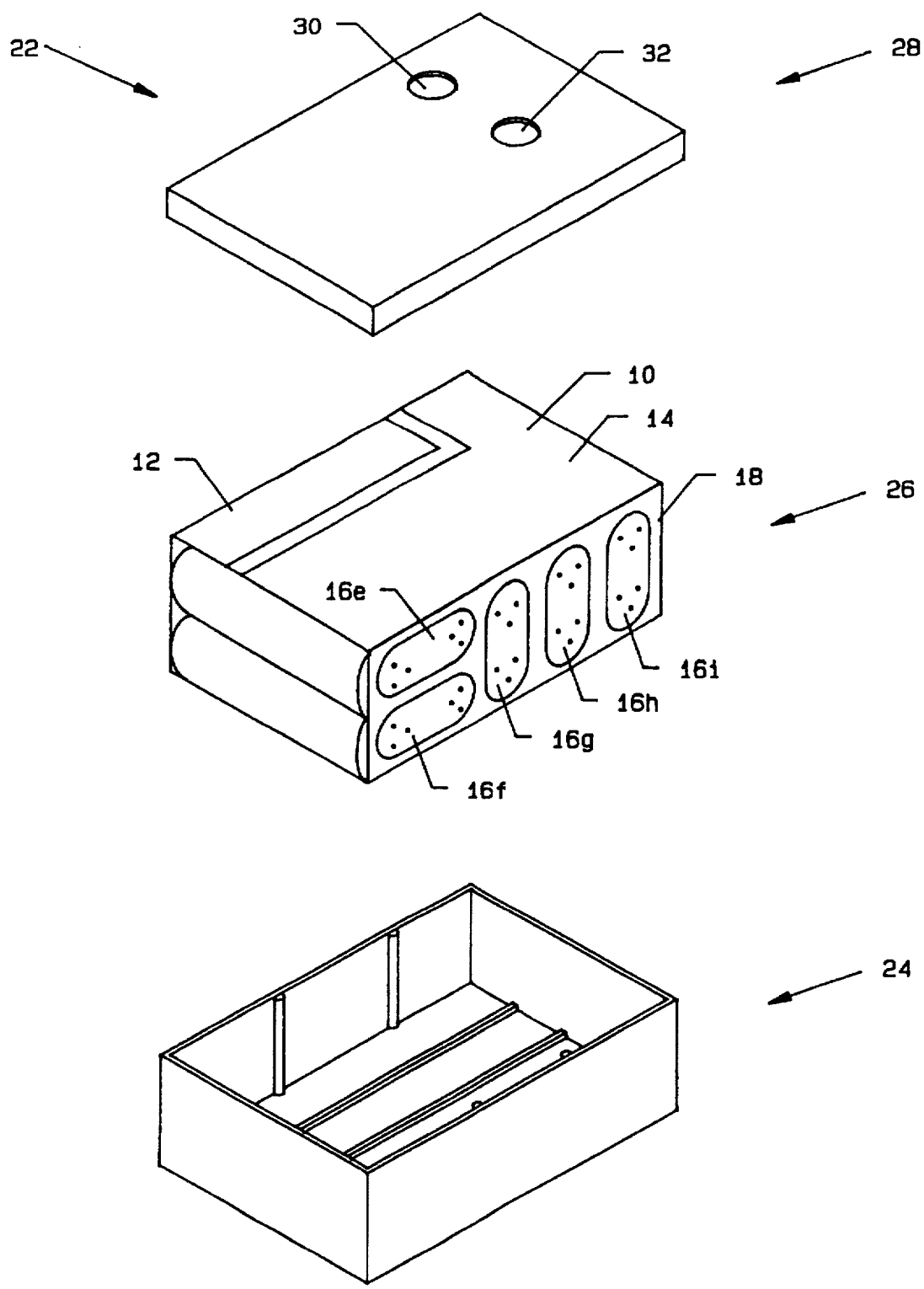
FIG. 5 illustrates an exploded view of a front view of the back half of a battery pack, the flexible welding board with battery cells, and a front view of the front half of the battery pack.

FIG. 5 illustrates an exploded view of a front view of a battery pack 22, including a back half 24. A flexible welding board 10 with the batteries forming a battery assembly 26, and a front view of the front half 28 of the battery pack 22. All numerals correspond to those elements previously described. The back half 24 of the battery pack 22 is essentially a small, rectangular box. The front half 28 of the battery pack 22 includes two holes 30 add 32 which provide for engagement of the terminal pads 12 and 14 of the flexible welding board 10 with the contact fingers of a Handie-Talkie radio when the battery pack 22 is inserted into the battery compartment of the Handie-Talkie radio. Other electrical or electromechanical components can be spot-welded to the flexible welding board 10, such as battery contacts, thermistors, thermal activated switches, diodes, or any other components.

MODE OF OPERATION

The flexible welding board 10 is manufactured by processes so that the welding allay geometrical configuration remains on the polyester film 18 after the processing steps. Representative processing steps are now described below.

1.a. The hole pattern for the bare backed board is first punched through the substrate film by use of a press, and a die constructed with shrink allowances for the material built into the die.

1.b. The circuit pattern is either laminated with dry resist film, with respect to the holes in the substrate film, or the circuit pattern is silk-screened onto the nickel alloy or other metal alloy or metal and then processed in a conventional manner. Either method is an acceptable process for laying out the circuit pattern of resist material on the alloy.

2. The nickel alloy or other alloy or metal is then processed in a suitable processing station, and particularly lends itself to horizontal processing with a plurality of stations. What is advantageous is that the material can be done in a reel-to-reel processing fashion because of the steps of laying out the resist pattern onto the nickel alloy or other metal alloy or metal material, which can be repetitive or can change on a long length of material, and then the material can be coiled at the input end and the output end of a processor.

3. The process station would include an etch chamber, a cascade rinse chamber, a fresh water rinse chamber, an inspection station, a spray stripping solution station for removal of the resist material, a fresh water rinse station, and a blower drying station.

4. The etch chamber uses a ferric chloride solution, which is a combination of ferric chloride and hydrochloric acid. Any other suitable etching solution is also acceptable. This particularly lends itself to etching of the nickel alloy or other metal alloy or metal and is advantageous because the ferric chloride etching solution is inexpensive, environmentally and economically preferred, and readily etches the nickel alloy or other metal alloy or metal. Any suitable caustic solution can be used to remove the resist over the welding board pattern which remains after the etching away of the nickel alloy or other alloy which was not coated with resist. After processing, the flexible welding board can be cut apart, such as on a paper cutter, or punched apart such as on a punch press. Alternatively, individual welding boards fabricated in form and subsequently removed after processing. The teachings of the present invention include a process to manufacture product of a flexible welding board, which can be for large sized battery packs, such as for HTs, to small sized battery packs, such as for Flip-Phones.

The product of the flexible welding board 10 of FIG. 1 is manufactured by the new and novel recognition that the nickel alloy or other metal alloy can be adhesively secured to the polyester film 18, which can then include spot-welded electrical or electromechanical components, including but not limited to the components selected from the group of: battery cells, resistors, capacitors, thermal cutouts, thermistors, diodes, jumper wires, battery contacts and any other electrical or electromechanical components.

Various modifications can be made to the present invention without departing from the apparent scope hereof.

We claim:

1. Process for producing a battery pack comprising the steps of:
    a. providing a polyester film;
    b. punching holes in said film;
    c. laminating a metal or metal alloy on said film;
    d. forming an electrical circuit pattern from said metal or metal alloy with portions of said circuit pattern overlying said punched holes;
    e. providing at least two batteries having terminals at opposite ends of each of said batteries;
    f. deforming said polyester film so that the terminals of said batteries engage said circuit pattern at said punched holes; and
    g. welding said circuit pattern to said terminals to thereby electrically interconnect said batteries.

2. The process of claim 1 wherein the step of laminating includes adhesively bonding said metal or metal alloy to said polyester film.

3. The process of claim 1 wherein the circuit pattern is formed by:
    a. silk screening an etch resist of an electrical circuit pattern on said metal or metal alloy;
    b. etching away unprotected metal or metal alloy; and,
    c. removing said etch resist to expose said electrical circuit pattern.

4. The process of claim 1 wherein said circuit pattern is formed with two discrete terminal pads to facilitate electrical connection to an external electrical device.

5. The process of claim 4 further including the steps of:
    a. providing a housing for said battery pack having two apertures; and,
    b. inserting said battery pack into said housing with said two terminal pads exposed through said apertures.

* * * * *